(12) United States Patent
Lee et al.

(10) Patent No.: US 6,787,910 B2
(45) Date of Patent: Sep. 7, 2004

(54) SCHOTTKY STRUCTURE IN GAAS SEMICONDUCTOR DEVICE

(75) Inventors: Cheng-Shih Lee, Tao Yuan (TW); Yi Chang, Hsin Chu (TW)

(73) Assignee: National Chiao Tung University, Hsinchu (TW)

( * ) Notice: Subject to any disclaimer, the term of this patent is extended or adjusted under 35 U.S.C. 154(b) by 107 days.

(21) Appl. No.: 10/200,118

(22) Filed: Jul. 23, 2002

(65) Prior Publication Data

US 2004/0016984 A1 Jan. 29, 2004

(51) Int. Cl.[7] .............................................. H01L 21/31
(52) U.S. Cl. ...................... 257/758; 257/473; 257/762
(58) Field of Search ............................ 257/473, 762, 257/773, 768, 472, 763–764, 750, 751, 758; 438/92, 570, 575, 580, 581, 582, 628

(56) References Cited

U.S. PATENT DOCUMENTS

| | | | |
|---|---|---|---|
| 4,985,750 A | * | 1/1991 | Hoshino ................. 257/758 X |
| 5,049,954 A | | 9/1991 | Shimada et al. |
| 5,695,810 A | | 12/1997 | Dubin et al. .................. 427/96 |
| 5,824,599 A | * | 10/1998 | Schacham-Diamand et al. .......... 438/678 |
| 6,288,449 B1 | | 9/2001 | Bhowmik et al. .......... 257/762 |

OTHER PUBLICATIONS

Chen et al., Backside Copper Metallization of GaAs MES-FETs using TaN as the Diffusion Barrier, IEEE Transactions on Electron Devices, vol. 48, No. 6, Jun. 6, 2001, pp. 1033–1036.*

Kim et al., Characteristics of Amorphous Tungsten Nitride Diffusion Barrier for Metal–Organic Chemical Vapor Deposited Cu Metallization, EDMS, 1994, pp. 21 to 24.*

* cited by examiner

Primary Examiner—Long Pham
Assistant Examiner—(Vikki) Hoa B. Trinh
(74) Attorney, Agent, or Firm—Troxell Law Office PLLC

(57) ABSTRACT

The present invention provides a Schottky Structure in gallium arsenide (GaAs) semiconductor device, which comprises a gallium arsenide (GaAs) semiconductor substrate, a titanium (Ti) layer on a surface of said gallium arsenide (GaAs) semiconductor substrate to form Schottky contact, a diffusion barrier layer on a surface of said titanium (Ti) layer to block metal diffusion, and a first copper layer on a surface of said diffusion barrier layer.

7 Claims, 4 Drawing Sheets

SCHOTTKY STRUCTURE IN GAAS SEMICONDUCTOR DEVICE

REFERENCE CITED

[1] U.S. Pat. No. 5,049,954.
[2] U.S. Pat. No. 5,695,810.
[3] U.S. Pat. No. 6,288,449.

BACKGROUND OF THE INVENTION

1. Field of the Invention

The present invention relates to a Schottky Structure in a gallium arsenide (GaAs) semiconductor device, particularly to a lower electric resistance and superior heat conductivity with a Schottky Structure. Therefore, this invention can be employed by an easy connective manufacturing process with other manufacturing process for gallium arsenide (GaAs) device.

2. Prior Arts

In General, the Ti/Pt/Au Schottky contact on n-GaAs is the most widely used Schottky structure in the fabrication of metal semiconductor field effect transistors (MESFET), high electron mobility transistors (HEMT) and Schottky diodes. In the Ti/Pt/Au structure, Titanium (Ti) layer provides good Schottky Contract, platinum (Pt) layer acts as a diffusion barrier, and Gold (Au) layer provides high electrical conductivity. Lately, new Schottky structures (Ti/W/Cu, Ti/Co/Cu, Ti/Mo/Cu) with copper and refractory diffusion barrier metal for GaAs semiconductor has become an important device in the field of copper process. A platinum (Pt) layer 32 is replaced with diffusion barrier layer of the refractory material such as tungsten (W), cobalt (Co), tantalum (Ta) and molybdenum (Mo) due to their superior electrical conductivity, lower resistivity and anti-diffusion capability. Gold (Au) layer is replaced with first copper layer due to their lower electric resistance and superior heat conductivity. Thus, it may increase electrical characteristics and it also may do copper process directly.

Kizahi Shimada et al., U.S. Pat. No. 5,049,954, GaAs field effect semiconductor device having Schottky gate structure, which discloses Ti film on a surface of gallium arsenide (GaAs) substrate, and a refractory electrode film on a surface of the Ti film including refractory metals, carbides, and nitrides. But, the present invention provides a first copper layer on a surface of diffusion barrier layer to form a Schottky Structure. Thus, a Schottky Structure which is more useful and of commercial value is obtained.

Valerg M. Dubin et al., U.S. Pat. No. 5,695,810, Use of cobalt tungsten phosphide as a barrier material for copper metallization, which discloses a CoWP barrier material to prevent copper diffusion. But, the present invention provides a diffusion barrier layer on a surface of said titanium (Ti) layer to block metal diffusion.

Siddhartha Bhowmik et al., U.S. Pat. No. 6,288,449, Barrier for copper metallization, which discloses a diffusion barrier layer with multiple layers Ta/TaN/TiN for copper metallization. But, the present invention provides a diffusion barrier layer with a single layer for copper process. Thus, it can be very useful for Schottky Structure.

OBJECTS OF THIS INVENTION

Therefore, the present invention provides a Schottky Structure in gallium arsenide (GaAs) semiconductor device with copper metallization.

The main object of the present invention is to provide a lower electric resistance and superior heat conductivity with Schottky Structure.

Another object of this invention is to provide a high frequency device with Schottky Structure.

The other object of this invention is to provide an easy connective manufacturing process with Cu metallization process.

SUMMARY OF THE INVENTION

The present invention provides a Schottky Structure in gallium arsenide (GaAs) semiconductor device. Please refer to FIG. 1, we disclose a schematic diagram of High Electron Mobility Transistors (HEMT), which comprises a semi-insulating gallium arsenide (GaAs) semiconductor substrate 1, a Schottky structure 2, a copper air bridge 3, air 4, a copper layer 5, a n-type gallium arsenide (n-GaAs) 6, and a nitride 7.

The gold (Au) was replaced with copper due to their lower electric resistance and superior heat conductivity.

Furthermore, the present invention overcomes a deep acceptor problem with copper process. Thus, it can be employed to Monolithic Microwave Integrated Circuit (MMIC). The present invention provides that a new Schottky Structure has excellent characteristic and cost compare to the conventional Ti/Pt/Au structure and can be used as the Schottky Structure for gallium arsenide (GaAs) device

BRIEF DESCRIPTION OF THE DRAWINGS

The present invention will be better understood from the following detailed description of preferred embodiments of the invention, taken in conjunction with the accompanying drawing, in which.

DESCRIPTION OF THE PREFERRED EMBODIMENTS

The following descriptions of the preferred embodiments are provided to understand the features and the structures of the present invention.

Figure 1:
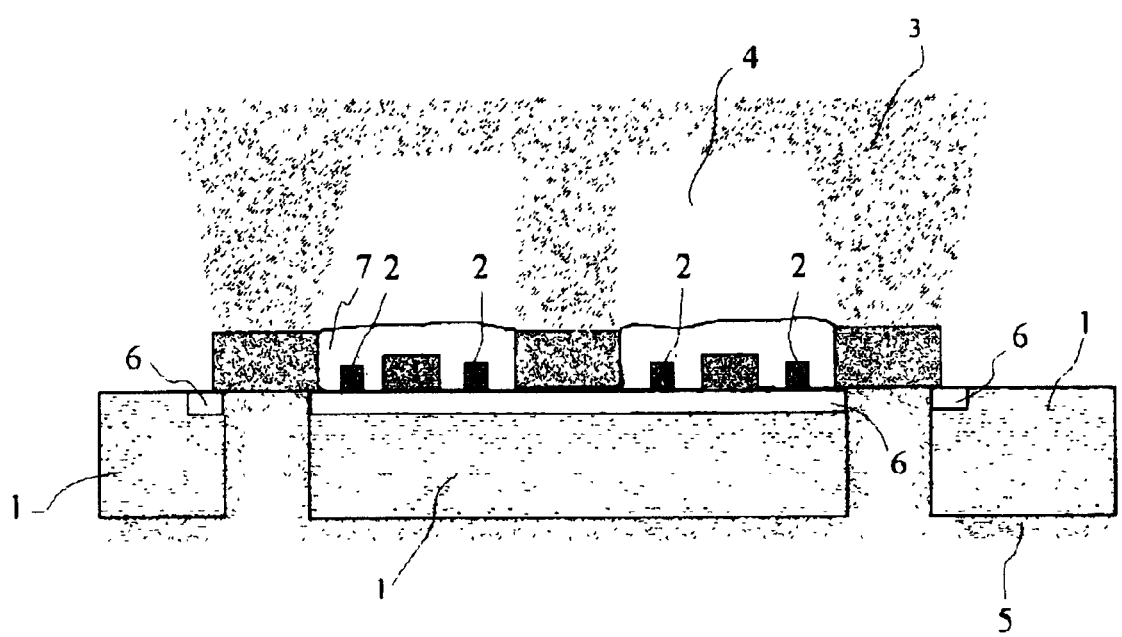
FIG. 1 illustrates a schematic diagram of High Electron Mobility Transistors (HEMT)
Figure 2:
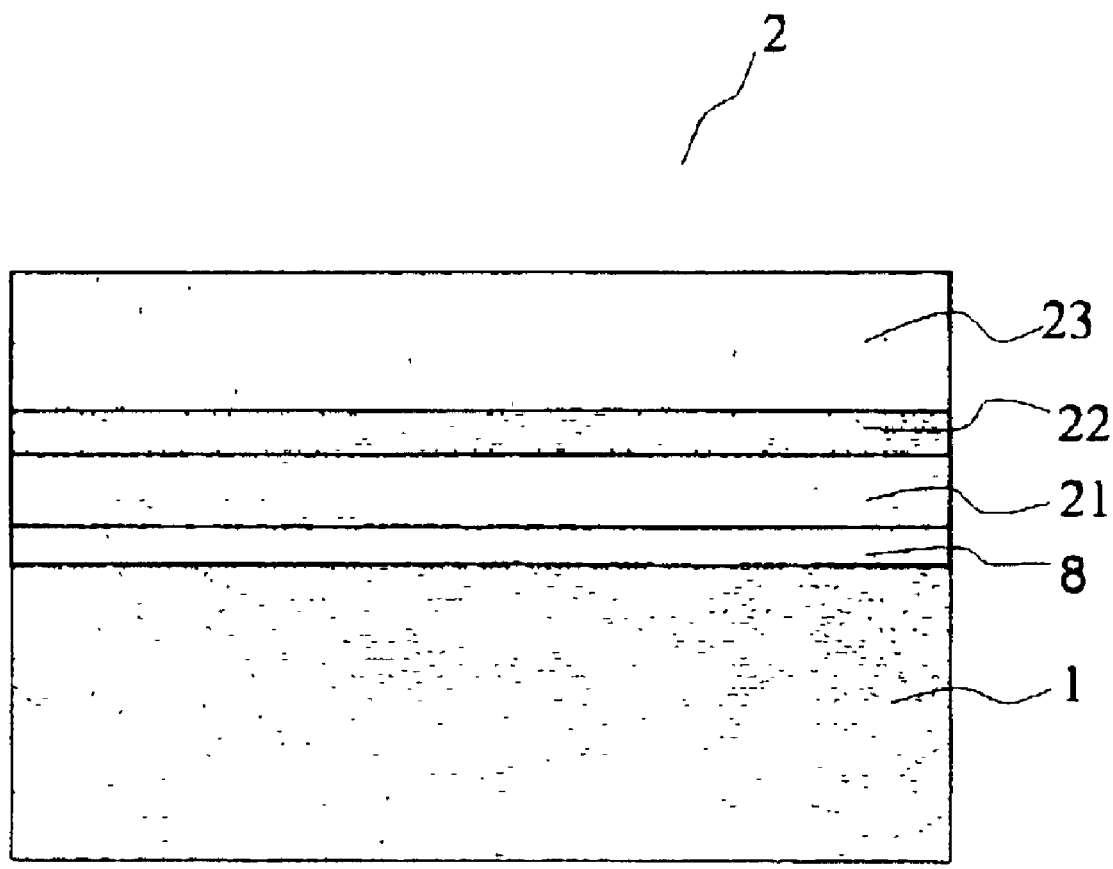
FIG. 2 illustrates a preferred embodiment of the present invention.

The present invention provides a Schottky Structure in gallium arsenide (GaAs) semiconductor device. Its purpose is to provide a copper process for industry. Please refer to FIG. 2, we disclose a Schottky Structure in gallium arsenide (GaAs) semiconductor device which comprises a semi-insulating gallium arsenide (GaAs) semiconductor substrate 1, a n-type gallium arsenide (n-GaAs) 8 on a surface of said semi-insulating gallium arsenide (GaAs) semiconductor substrate 1, a titanium (Ti) layer 21 on a surface of said n-type gallium arsenide (n-GaAs) 8 to form Schottky contact, a diffusion barrier layer 22 on a surface of said titanium (Ti) layer 21 to block metal diffusion, and a first copper layer 23 on a surface of said diffusion barrier layer 22 to form Schottky Structure. Wherein metal diffusion is blocked by the diffusion barrier layer during further copper processing of the first copper layer 23.

Figure 3:
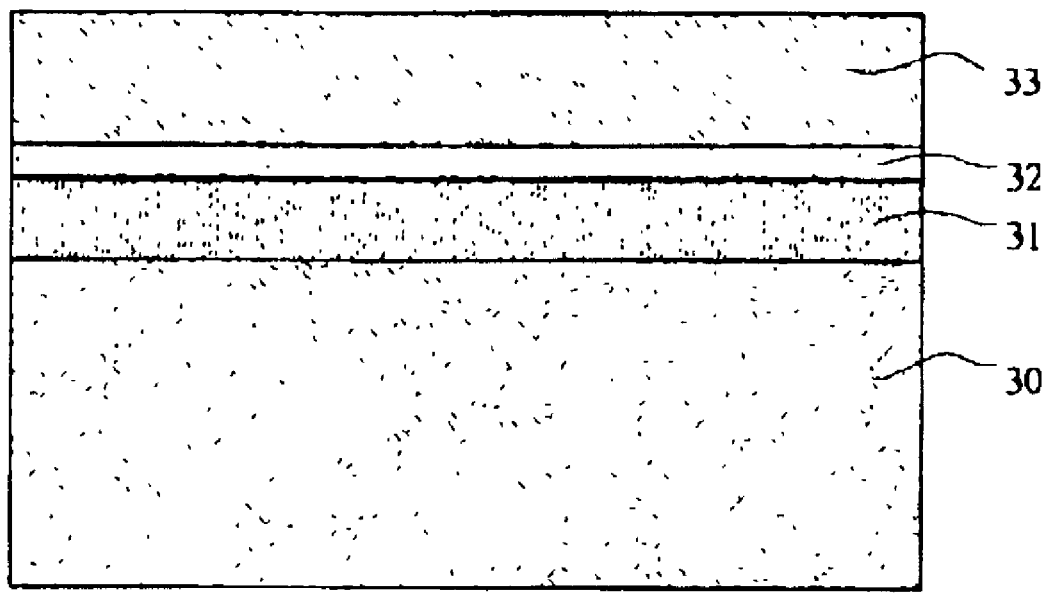
FIG. 3 illustrates a conventional schematic diagram of a Schottky Structure in gallium arsenide (GaAs) semiconductor device.

Referring to the FIG. 3, we illustrate a conventional schematic diagram of a Schottky Structure in gallium arsenide (GaAs) semiconductor device which comprises a gallium arsenide (GaAs) semiconductor substrate 30, a titanium (Ti) layer 31 on a surface of said gallium arsenide (GaAs) semiconductor substrate 30 to form Schottky contact, a platinum (Pt) layer 32 on a surface of said titanium (Ti) layer 31 to block metal diffusion, and a gold (Au) layer 33 on a surface of said platinum (Pt) layer 32 to form Schottky Structure. Gold (Au) line and Gold (Au) air bridge are replaced by copper and plating barrier layer on a surface of said aurum (Au) layer 33 to block aurum (Au) and copper diffusion when the copper process is used in gallium arsenide GaAs devices.

Figure 4:
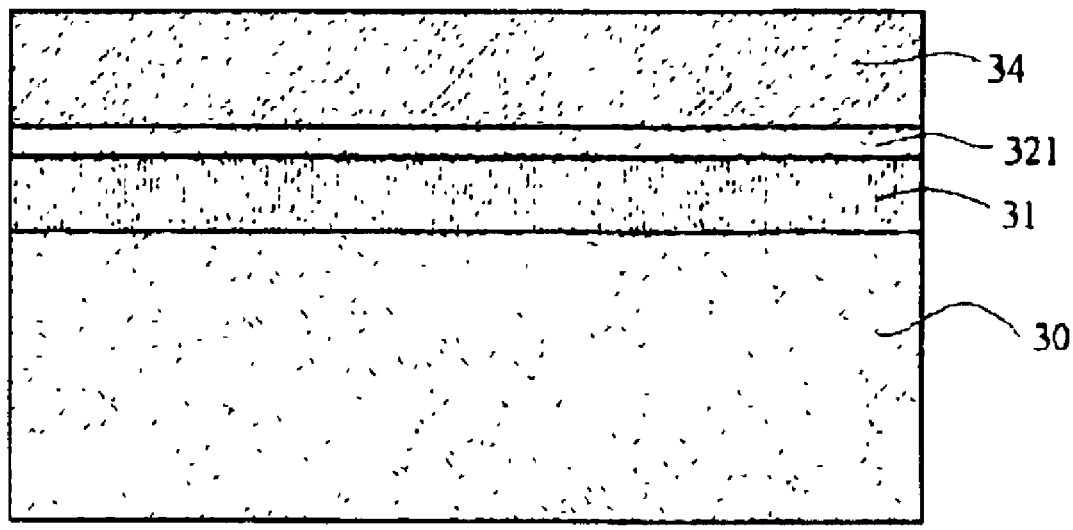
FIG. 4 illustrates another preferred embodiment of the present invention.

The present invention provides a Schottky Structure in a gallium arsenide (GaAs) semiconductor device with a copper process. FIG. 4 illustrates another preferred embodiment of the present invention, which comprises a gallium arsenide (GaAs) semiconductor substrate 30, a titanium (Ti) layer 31 on a surface of said gallium arsenide (GaAs) semiconductor substrate 30 to form Schottky contact, a diffusion barrier layer 321 on a surface of said titanium (Ti) layer 31 to block metal diffusion, and a first copper layer 34 on a surface of said diffusion barrier layer 321 to form Schottky Structure.

Furthermore refer to FIG. 4, a titanium (Ti) layer 31 on a surface of said gallium arsenide (GaAs) semiconductor substrate 30 has a thickness of 30 nm to 200 nm and is deposited on a gallium arsenide (GaAs) semiconductor substrate 30 by sputtering or evaporation. A diffusion barrier layer 321 on a surface of said titanium (Ti) layer 31 has a specific thickness between 30 nm to 100 nm and is comprised of at least one refractory material selected from the group consisting of Tungsten (W), tungsten nitride (WN), cobalt (Co), tantalum (Ta), tantalum nitride (TaN) and molybdenum (Mo). A first copper layer 34 on a surface of said diffusion barrier layer 321 has a specific thickness between 200 nm to 500 nm. Gold (Au) layer 33 was replaced with first copper layer 34 due to their lower electric resistance and superior heat conductivity. A platinum (Pt) layer 32 was replaced with diffusion barrier layer 321 of at least one refractory material selected from the group consisting of Tungsten (W), cobalt (Co), tantalum (Ta) and molybdenum (Mo) due to their superior electrical conductivity, lower resistivity and anti-diffusion capability. Thus, it may increase electrical characteristics and it also may do copper process directly, which does not only possess a better practicality, neither only a conception based on familiarity of utilization, it is non-obviousness.

Moreover, this invention diffusion barrier layer 321 is deposited by sputtering. Further, titanium (Ti) layer and first copper layer are deposited by sputtering or evaporation, which is useful.

In summation of the foregoing section, the invention herein fully complies will all new patent application requirement and is hereby submitted to the patent bureau for review and the granting of the commensurate patent rights.

The present invention may be embodied in other specific forms without departing from the spirit of the essential attributes thereof; therefore, the illustrated embodiment should be considered in all respects as illustrative and not restrictive, reference being made to the appended claims rather than to the foregoing description to indicate the scope of the invention.

What is claimed is:

1. A Schottky Structure in GaAs semiconductor device which comprises:

a gallium arsenide (GaAs) semiconductor substrate;

a titanium (Ti) layer located on a surface of said gallium arsenide (GaAs) semiconductor substrate to form a Schottky contact;

a diffusion barrier layer located on a surface of said titanium (Ti) layer to block copper metal diffusion, the diffusion barrier layer includes at least one refractory material selected from the group consisting of cobalt (Co) and molybdenum (Mo); and a first copper layer located on a surface of said diffusion layer, whereby said diffusion barrier layer blocks copper metal diffusion during surface treatment of said first copper layer.

2. The Schottky Structure of claim 1, wherein said titanium (Ti) layer substantially has a specific thickness between 50 nm to 100 nm.

3. The Schottky Structure of claim 1, wherein said titanium (Ti) layer is deposited on a gallium arsenide (GaAs) semiconductor substrate by sputtering or evaporation.

4. The Schottky Structure of claim 1, wherein said diffusion barrier layer is deposited on said titanium (Ti) layer by sputtering or evaporation.

5. The Schottky Structure of claim 1, wherein said diffusion barrier layer substantially has a specific thickness between 30 nm to 100 nm.

6. The Schottky Structure of claim 1, wherein first copper layer substantially has a specific thickness between 200 nm to 500 nm.

7. The Schottky Structure of claim 1, wherein first copper layer is deposited on said diffusion barrier layer by sputtering or evaporation.

* * * * *